United States Patent [19]

Mizuno

[11] Patent Number: 5,375,650
[45] Date of Patent: Dec. 27, 1994

[54] LIQUID COOLANT CIRCULATION CONTROL SYSTEM FOR IMMERSION COOLING SYSTEMS

[75] Inventor: Tsukasa Mizuno, Tokyo, Japan
[73] Assignee: NEC Corporation, Tokyo, Japan
[21] Appl. No.: 975,734
[22] Filed: Nov. 13, 1992
[30] Foreign Application Priority Data
Nov. 15, 1991 [JP] Japan .................. 3-327020
[51] Int. Cl.$^5$ ............................. B60H 1/00
[52] U.S. Cl. ................... 165/40; 62/259.2; 165/104.33; 417/43
[58] Field of Search .......... 165/104.33; 62/49.1, 62/259.2, 119, DIG. 2; 417/43

[56] References Cited

U.S. PATENT DOCUMENTS

| | | | |
|---|---|---|---|
| 2,767,277 | 10/1956 | Wirth | 417/43 X |
| 4,590,538 | 5/1986 | Cray, Jr. | 361/385 |
| 4,795,314 | 1/1989 | Prybella et al. | 417/43 |
| 4,898,231 | 2/1990 | Miyazaki | 165/13 |
| 4,913,625 | 4/1990 | Gerlowski | 417/43 X |
| 4,928,207 | 5/1990 | Chrysler et al. | 361/385 |
| 5,131,233 | 7/1992 | Cray et al. | 62/259.2 |
| 5,240,380 | 8/1993 | Mabe | 417/43 |

FOREIGN PATENT DOCUMENTS

3070975  3/1991  Japan .................. 62/259.2

Primary Examiner—William E. Wayner
Attorney, Agent, or Firm—Sughrue, Mion, Zinn, Macpeak & Seas

[57] ABSTRACT

A liquid coolant circulation control system that minimizes the requisite feed pressure and keeps the flow rate of a liquid coolant constant includes a casing accommodating electronic circuits to be immersed in and cooled by a liquid coolant, a feed pump for feeding the liquid coolant to the casing, and a collecting pump for collecting the liquid coolant from the casing. A first measuring meter, interposed between the feed pump and the casing, measures a flow rate and/or a pressure of the liquid coolant flowing into the casing. A second measuring meter, interposed between the casing and the collecting pump, measures a flow rate and/or a pressure of the liquid coolant flowing out of the casing. A determining section calculates a difference or differences between the two flow rates and/or pressures. The determining section sends this information to a control section. The control section controls the output of one or both pumps, so that the difference or differences remain at a predetermined value. The liquid coolant circulation control system is also provided with a heat exchanger that cools the liquid coolant to a predetermined temperature, and a buffer tank that absorbs an increase or decrease in the volume of the liquid coolant.

7 Claims, 8 Drawing Sheets

LIQUID COOLANT CIRCULATION CONTROL SYSTEM FOR IMMERSION COOLING SYSTEMS

BACKGROUND OF THE INVENTION

The present invention relates to an immersion cooling system for cooling electronic sections included in a data processor or similar electronic apparatus by immersing them in a liquid coolant. More particularly, the present invention is concerned with a liquid coolant circulation control system for minimizing the required feed pressure and maintaining the flow rate of a liquid coolant constant while the coolant is circulated.

An immersion cooling system mentioned above is disclosed in, for example, U.S. Pat. No. 4,590,538. This U.S. Patent discloses an immersion cooling system having a hollow cylindrical tank storing an inert liquid coolant therein. A plurality of frames are arranged radially in the tank and support a plurality of electronic circuit modules in a stack configuration. A plurality of coolant feeding members and a plurality of coolant collecting members are supported by nearby frames while alternating with each other. These members form passages for the coolant. A plurality of pumps cause the coolant to circulate. A plurality of heat exchangers cool the coolant having been heated by causing it to release heat. This type of conventional immersion cooling system has some problems left unsolved, as follows.

To begin with, each pump has to feed the coolant under a pressure high enough to overcome losses ascribable to the resistance of the heat exchangers, tank and so forth to the flow of the coolant. As a result, the pressure acting on the coolant itself increases which raise the boiling point of the coolant in the tank, thereby suppressing nuclear boiling cooling.

Another problem is that the tank and other members defining the liquid passages have to be provided with high resistivity to pressure since the pressure acting on the passages increases.

SUMMARY OF THE INVENTION

It is, therefore, an object of the present invention to provide a liquid coolant circulation control system which maintains the pressure acting on a liquid coolant and liquid passages constant and low to thereby promote nuclear boiling cooling, i.e., to enhance efficient cooling while implementing members defining the passages with low resistivity to pressure.

A liquid coolant circulation control system for an immersion cooling system of the present invention comprises a casing accommodating electronic circuits to be immersed in and cooled by a liquid coolant, a collecting pump for collecting the liquid coolant from the casing, first measuring means for measuring a flow rate of the liquid coolant flowing into the casing, second measuring means interposed between the casing and the collecting pump for measuring a flow rate of the liquid coolant flowing out of the casing, determining means for calculating a difference between the flow rates measured by the first and second measuring means, and control means for controlling the operation of the collecting pump such that the difference determined by the determining means remains at a predetermined value.

BRIEF DESCRIPTION OF THE DRAWINGS

The features and advantages of the present invention will become apparent from the following description when taken in conjunction with the accompanying drawings in which:

FIGS. 1-7 are block diagrams schematically showing a first to a seventh embodiment of the present invention, respectively.

In the figures, the same reference numerals designate the same structural elements.

DETAILED DESCRIPTION OF THE PREFERRED EMBODIMENTS

Figure 8:
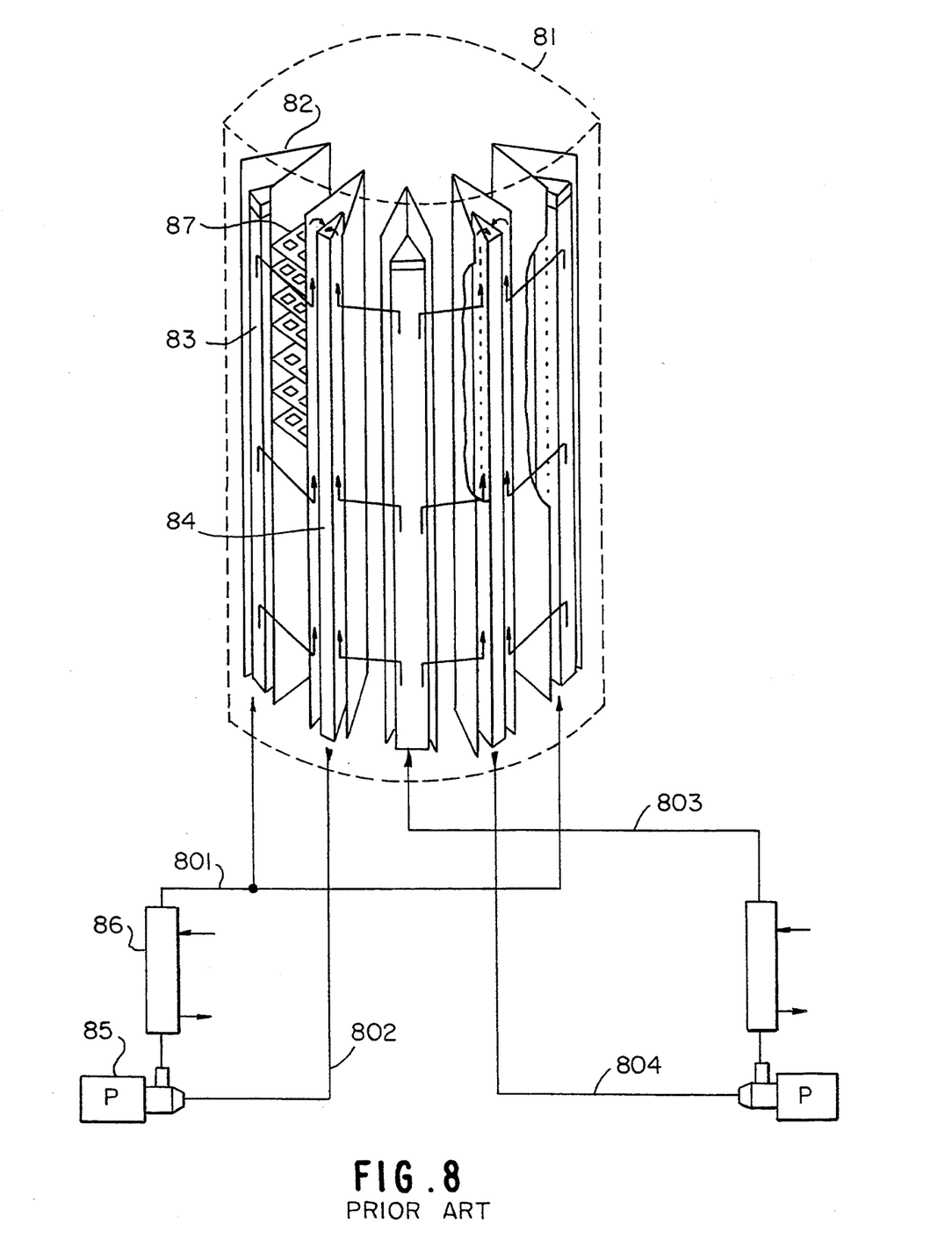
FIG. 8 is a block diagram schematically showing a conventional immersion cooling system.

To better understand the present invention, a brief reference will be made to a conventional immersion cooling system, shown in FIG. 8. As shown, the conventional system has a hollow cylindrical tank 81 storing an inert liquid coolant therein. A plurality of frames 82 are arranged radially in the tank 81 and support a plurality of electronic circuit modules 87 in a stack configuration. A plurality of coolant feeding members 83 and a plurality of coolant collecting members 84 are supported by nearby frames 82 while alternating with each other. These members 83 and 84 form passages for the coolant. A plurality of pumps 85 cause the coolant to circulate. A plurality of heat exchangers 86 cool the coolant having been heated by causing it to release heat. The coolant cooled by the heat exchangers 86 is fed to the coolant feeding members 83 by first conduits 801 and 803. The coolant heated by the electronic circuit modules 87 is returned to the pump 85 via the coolant collecting member 84 by second conduits 802 and 804.

Figure 1:
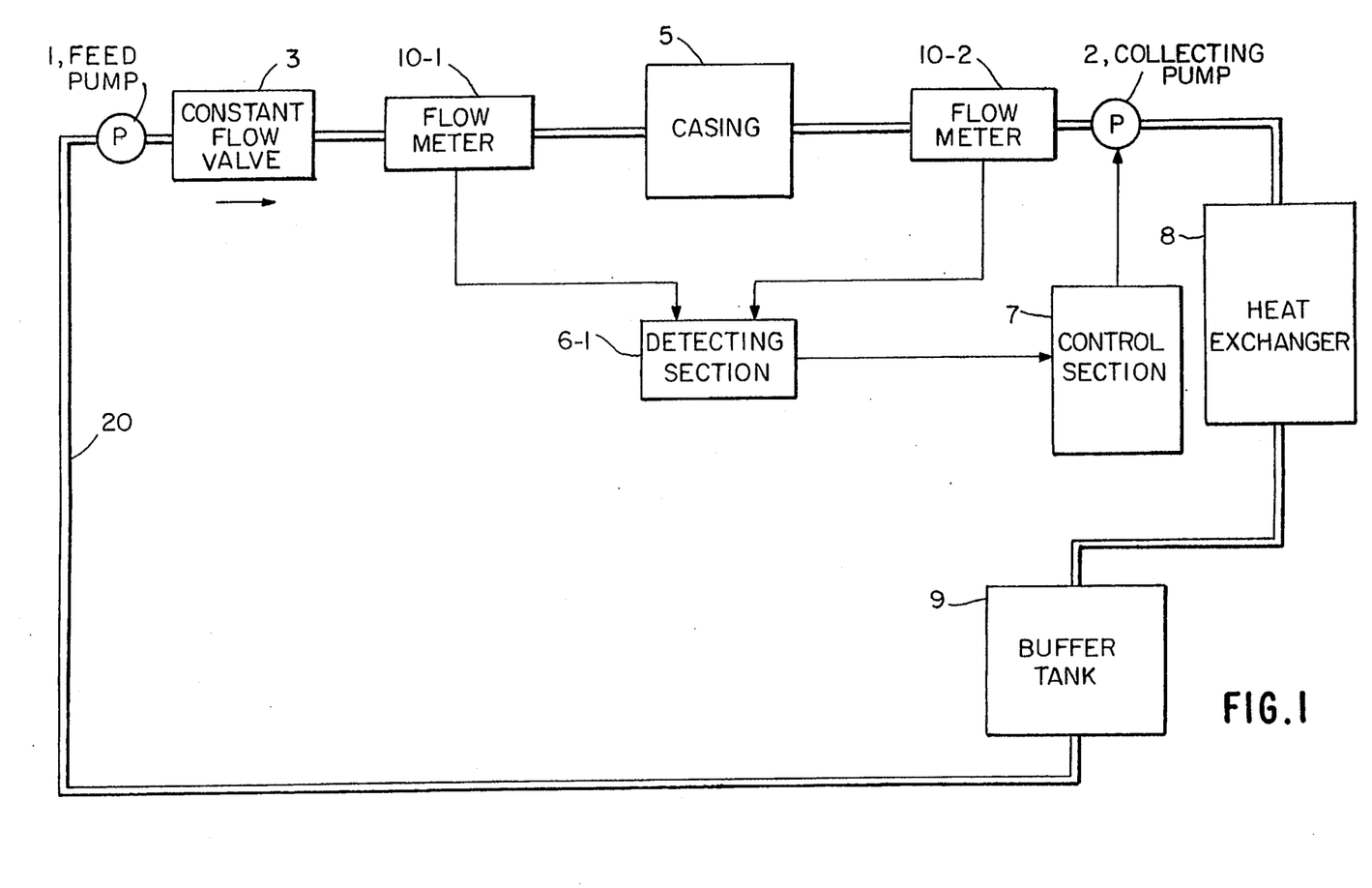

Referring to FIG. 1, a first embodiment of the present invention is shown and includes a feed pump 1 for feeding a liquid coolant, e.g., Fluorinert available from 3M, to a coolant passage. A collecting pump 2 collects the coolant. A constant flow valve 3 delivers the coolant while adjusting it to a desired flow rate. A casing 5 accommodates therein electronic circuits, not shown, to be cooled by the coolant by immersion. A detecting section 6-1 detects a difference in flow rate between the coolant entering the casing 5 and the coolant coming out of the casing 5. A control section 7 controls the output of the collecting pump 2. A heat exchanger 8 cools the coolant, having been heated by the electronic circuits of the casing 5, to a predetermined temperature. A buffer tank 9 is provided for absorbing the increase or decrease in the volume of the coolant due to temperature. Electronic flow meters 10-1 and 10-2 each measures the flow rate of the coolant in the associated coolant passage. The reference numeral 20 designates a piping through which the coolant circulates. In the figure, an arrow indicates the direction in which the coolant flows.

In operation, while liquid coolant is fed from the feed pump 1 to the casing 5, the constant flow valve 3 provides it with a desired flow rate. The coolant from the casing 5 is collected by the collecting pump 2 under the following control.

The flow meters 10-1 and 10-2 measure respectively the flow rate of the coolant flowing into the casing 5 and the flow rate of the coolant flowing out of the casing 5. The measured flow rates are sent from the flow meters 10-1 and 10-2 to the detecting section 6-1. In response, the detecting section 6-1 calculates a difference $\Delta L$ between the two flow rates and sends it to the control section 7. Then, the control section 7 controls the output of the collecting pump 2 such that the difference $\Delta L$ decreases to zero. For this purpose, the control section 7 may be provided with a linear control mechanism using an inverter. By so controlling the output of the collecting pump 2, it is possible to maintain the pressure in the casing 5 constant substantially at the atmospheric level. Therefore, the boiling point of the coolant in the casing 5 is prevented from rising. This is successful in promoting nuclear boiling cooling, i.e., enhancing the cooling efficiency. In addition, the pressure maintained substantially at the atmospheric level allows casing 5 and associated passage members to be designed with low resistivity to pressure.

Figure 2:
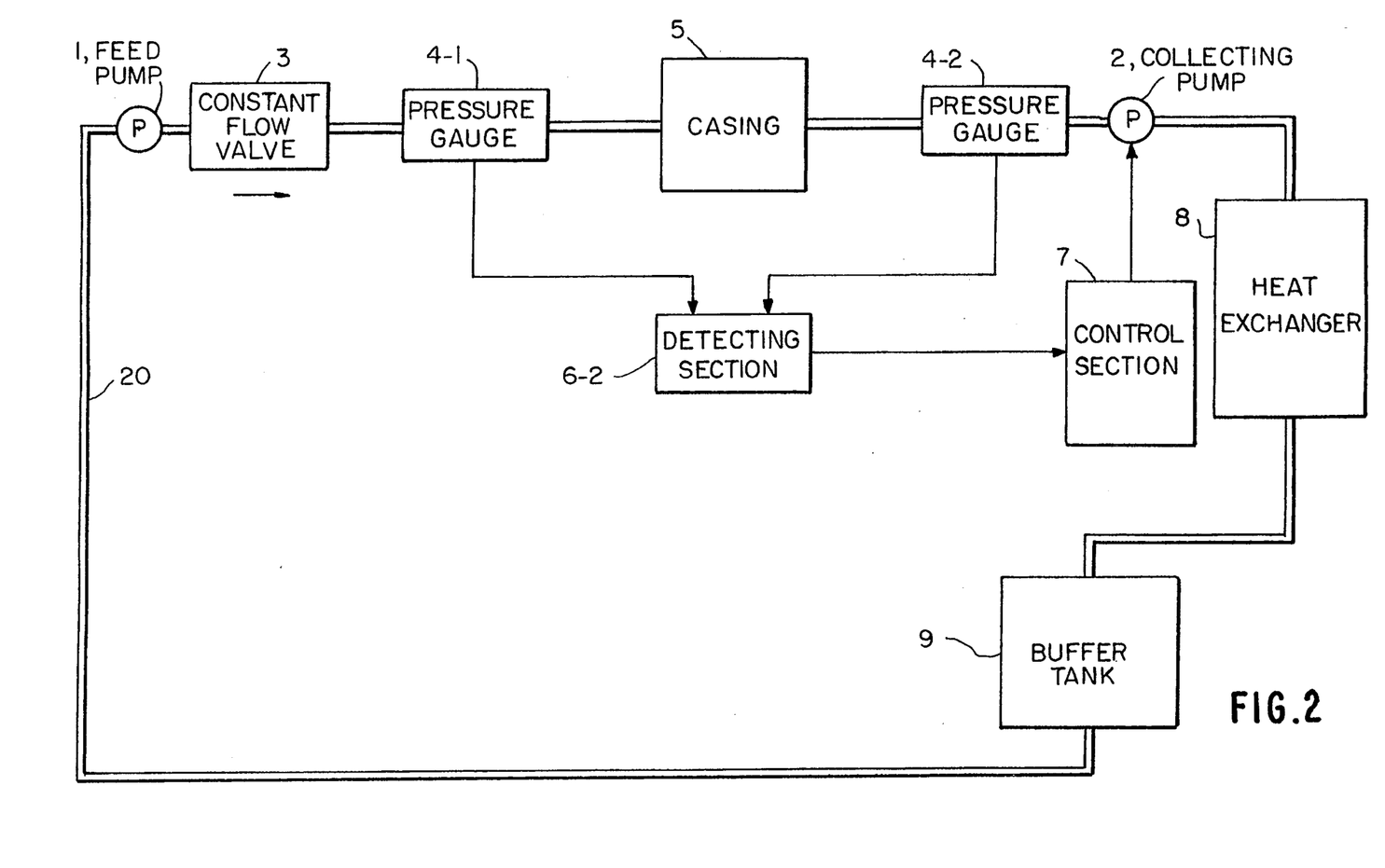

FIG. 2 shows a second embodiment of the present invention which also includes the feed pump 1, collecting pump 2, constant flow valve 3, and casing 5. Pressure gauges 4-1 and 4-2 measure respectively the pressure acting on the coolant flowing into the casing 5 and the pressure acting on the coolant flowing out of the casing 5. A detecting section 6-2 receives the measured pressures from the pressure gauges 4-1 and 4-2 to determine their difference $\Delta P$. A control section 7 controls the output of the collecting pump 2 in response to the pressure difference $\Delta P$ fed thereto from the detecting section 6-2. The heat exchanger 8, buffer tank 9 and piping 20 are identical with those of the first embodiment.

In operation, on receiving the measured pressures from the pressure gauges 4-1 and 4-2, the detecting section 6-2 calculates a difference $\Delta P$ between the pressures and sends it to the control section 7. In response, the control section 7 controls the output of the collecting pump 2 such that the pressure difference $\Delta P$ goes to a predetermined value. The control section 7 may also be implemented by a linear control mechanism using an inverter. In this manner, the output of the pump 2 is so controlled as to control the difference in pressure between the coolant entering the casing 1 and the coolant coming out of the same. This is also successful in maintaining the pressure in the casing 5 constant substantially at the atmospheric level. This embodiment, therefore, achieves the same advantages as those of the first embodiment.

Figure 3:
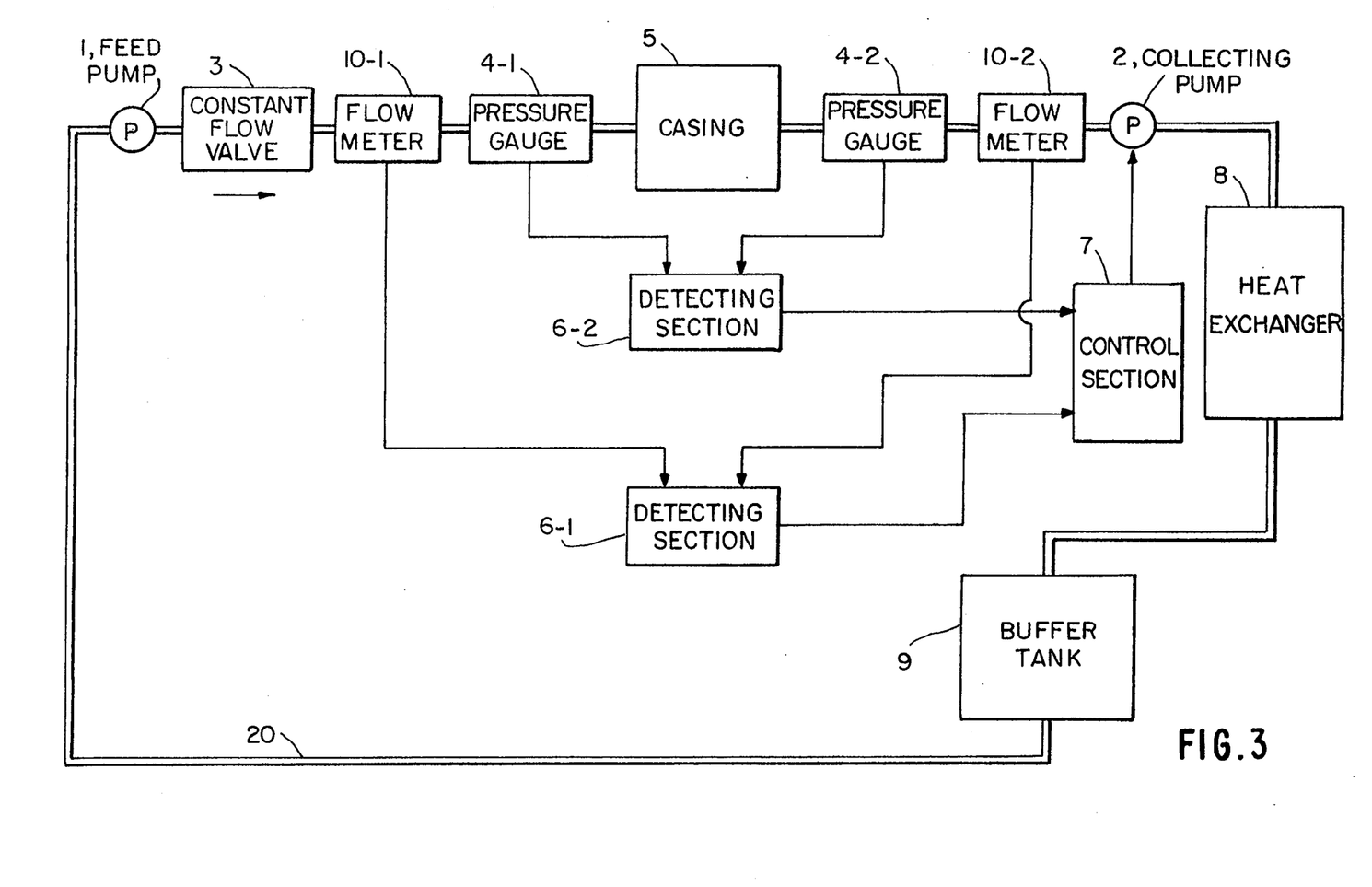

Referring to FIG. 3, a third embodiment of the present invention includes the feed pump 1, collecting pump 2, and casing 5. Electronic flow meters 10-1 and 10-2 are respectively responsive to the flow rate of the coolant flowing into the casing 5 and that of the coolant flowing out of the casing 5. The pressure gauges 4-1 and 4-2 are respectively responsive to the pressure acting on the coolant flowing into the casing 5 and the pressure acting on the coolant flowing out of the casing 5, as sated earlier. The detecting section 6-1 determines a difference $\Delta L$ between the flow rates sent thereto from the flow meters 10-1 and 10-2, while the detecting section 6-2 determines a difference $\Delta P$ between the pressures sent thereto from the pressure gauges 4-1 and 4-2. In response to the differences $\Delta L$ and $\Delta P$, the control section 6-1 controls the output of the collecting pump 2. The embodiment further includes the previously stated heat exchanger 8, buffer tank 9, and piping 20.

In operation, the flow rates measured by the flow meters 10-1 and 10-2 and the pressures measured by the pressure gauges 4-1 and 4-2 are sent to the detecting sections 6-1 and 6-2, respectively. In response, the detecting section 6-1 determines a difference $\Delta L$ between the two flow rates and sends it to the control section 7. Likewise, the detecting section 6-2 calculates a difference $\Delta P$ between the two pressures and sends it to the control section 7. Then, the control section 7 so controls the output of the pump 2 as to reduce the differences $\Delta L$ to zero and $\Delta P$ to the predetermined value. Again, the control section 7 may be implemented by a linear control mechanism using an inverter.

Since this embodiment controls the output of the collecting pump 2 such that both of the differences $\Delta L$ decrease to zero and $\Delta P$ to the predetermined value, it maintains the pressure in the casing 5 substantially at the atmospheric level more positively than the first and second embodiments.

Figure 4:
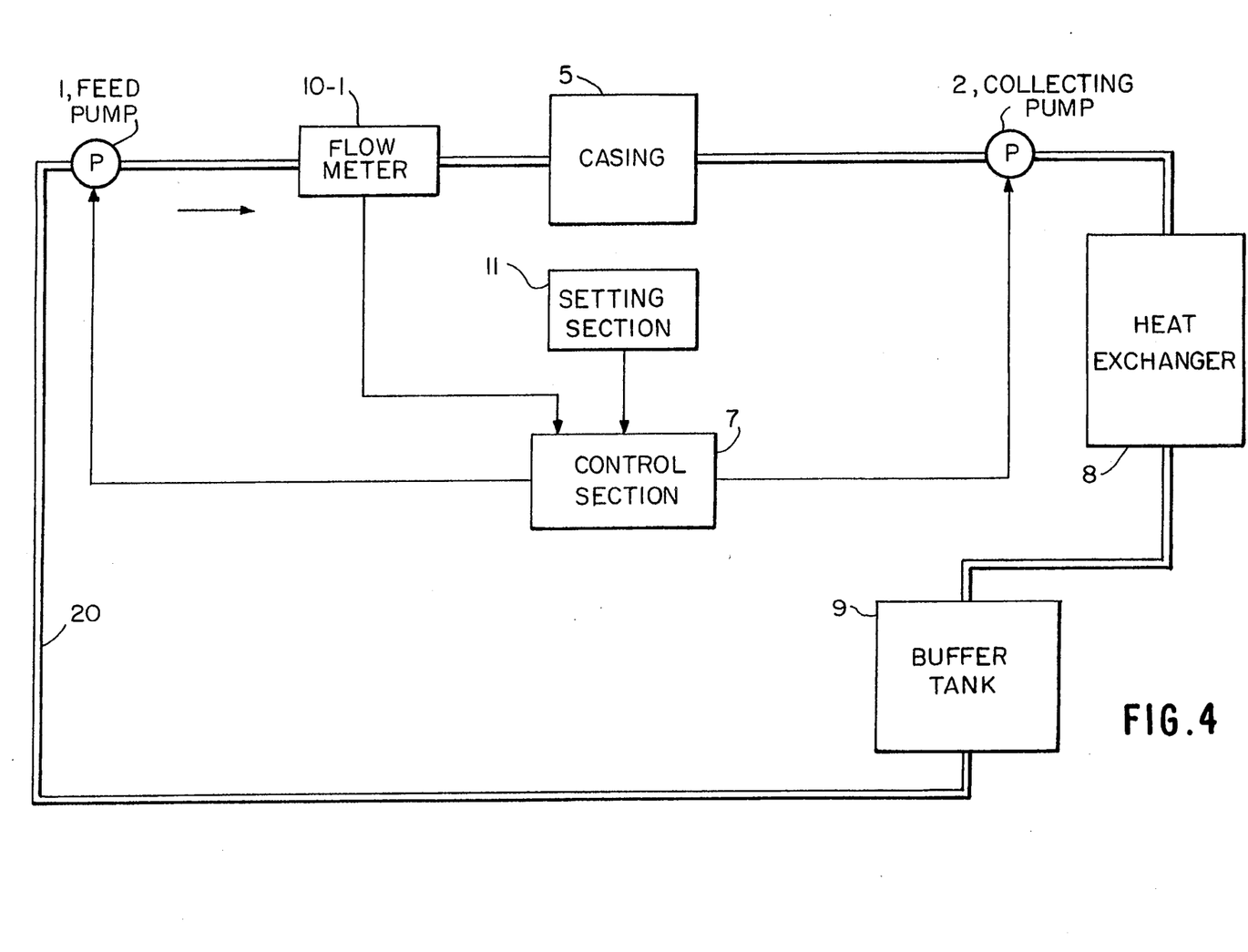

FIG. 4 shows a fourth embodiment of the present invention. As shown, this embodiment has a setting section 11 for setting a desired flow rate, in addition to the feed pump 1, collecting pump 2, casing 5, flow meter 10-1, control section 7, heat exchanger 8, buffer tank 9 and piping 20.

In operation, the flow meter 10-1 measures the flow rate of the coolant flowing into the casing 5 and sends it to the control section 7. The setting section 11 holds a preset flow rate of the coolant. In the illustrative embodiment, the pumps 1 and 2 have the same ability. By comparing the flow rate from the flow meter 10-1 with the preset flow rate from the setting section 11, the control section 7 controls the outputs of the pumps 1 and 2 at the same time such that the former coincides with the latter. Such control may also be effected by a linear control mechanism using an inverter.

As stated above, this embodiment controls the outputs of the feed pump 1 and collecting pump 2 at the same time such that the flow rate of the coolant entering the casing 1 coincides with the preset flow rate. As a result, the pressure in the casing 5 is maintained substantially at the atmospheric level, whereby the advantages stated in relation to the first embodiment are achieved.

Figure 5:
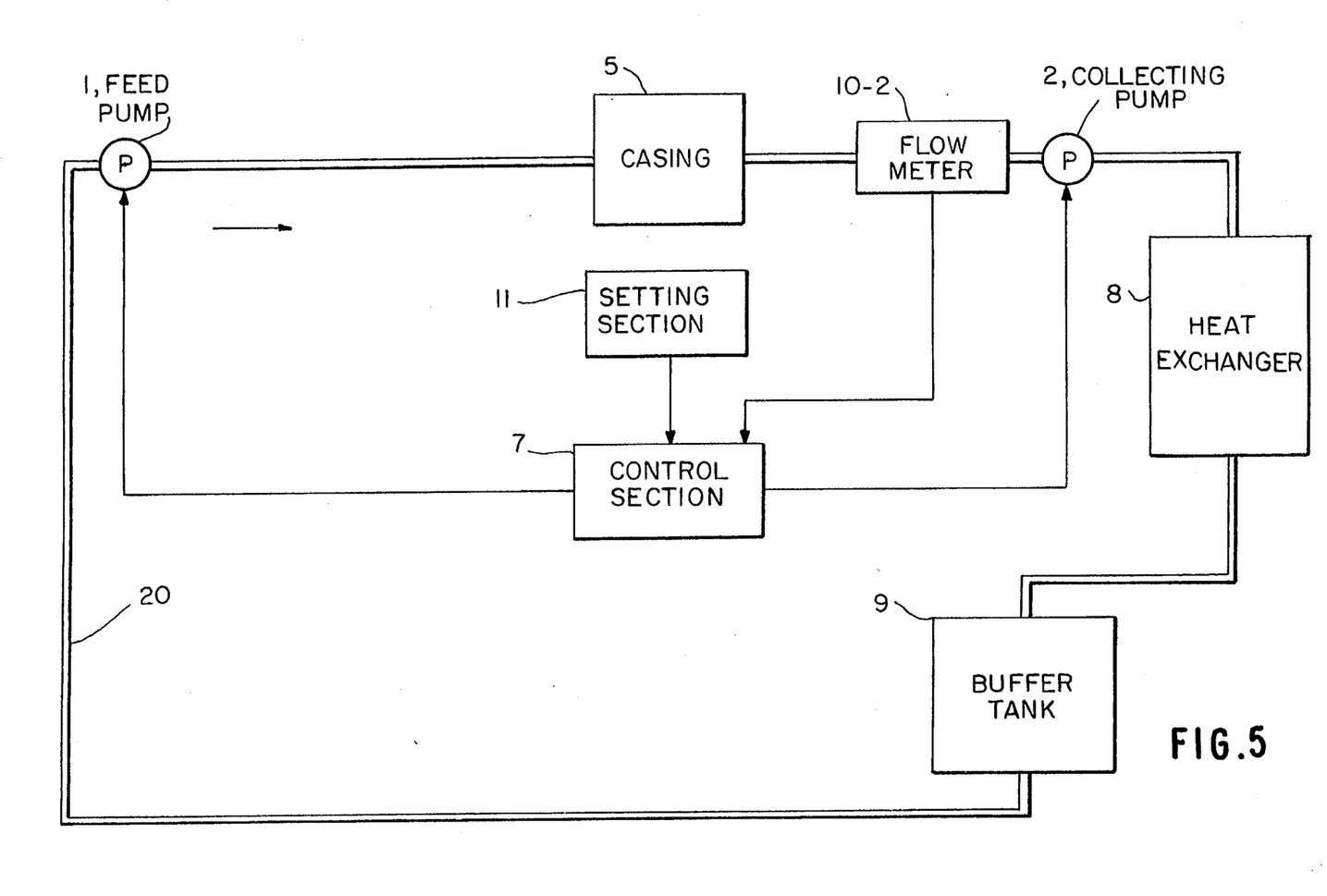

FIG. 5 shows a fifth embodiment of the present invention which is made up of the feed pump 1, collecting pump 2, casing 5, electronic flow meter 10-2, setting section 11 holding a preset flow rate, control section responsive to the outputs of the flow meter 10-2 and setting section 11, heat exchanger 8, buffer tank 9, and piping 20.

In operation, the flow meter 10-2 measures the flow rate of the coolant flowing out of the casing 5 and sends it to the control section 7. In the illustrative embodiment, the feed pump 1 and collecting pump 2 have the same output, as in the fourth embodiment. The control section 7 compares the flow rate from the flow meter 10-2 with the preset flow rate from the setting section 11 and controls the outputs of the pumps 1 and 2 such that the former coincides with the latter. For this purpose, use may be made of a linear control mechanism using an inverter, as in the previous embodiments.

As described above, this embodiment so controls the outputs of the two pumps 1 and 2 as to equalize the flow rate of the coolant flowing out of the casing 5 and the preset flow rate. This is also successful in maintaining the pressure in the casing 5 constant substantially at the atmospheric level and, therefore, achieving the advantages stated in relation to the first embodiment.

Figure 6:
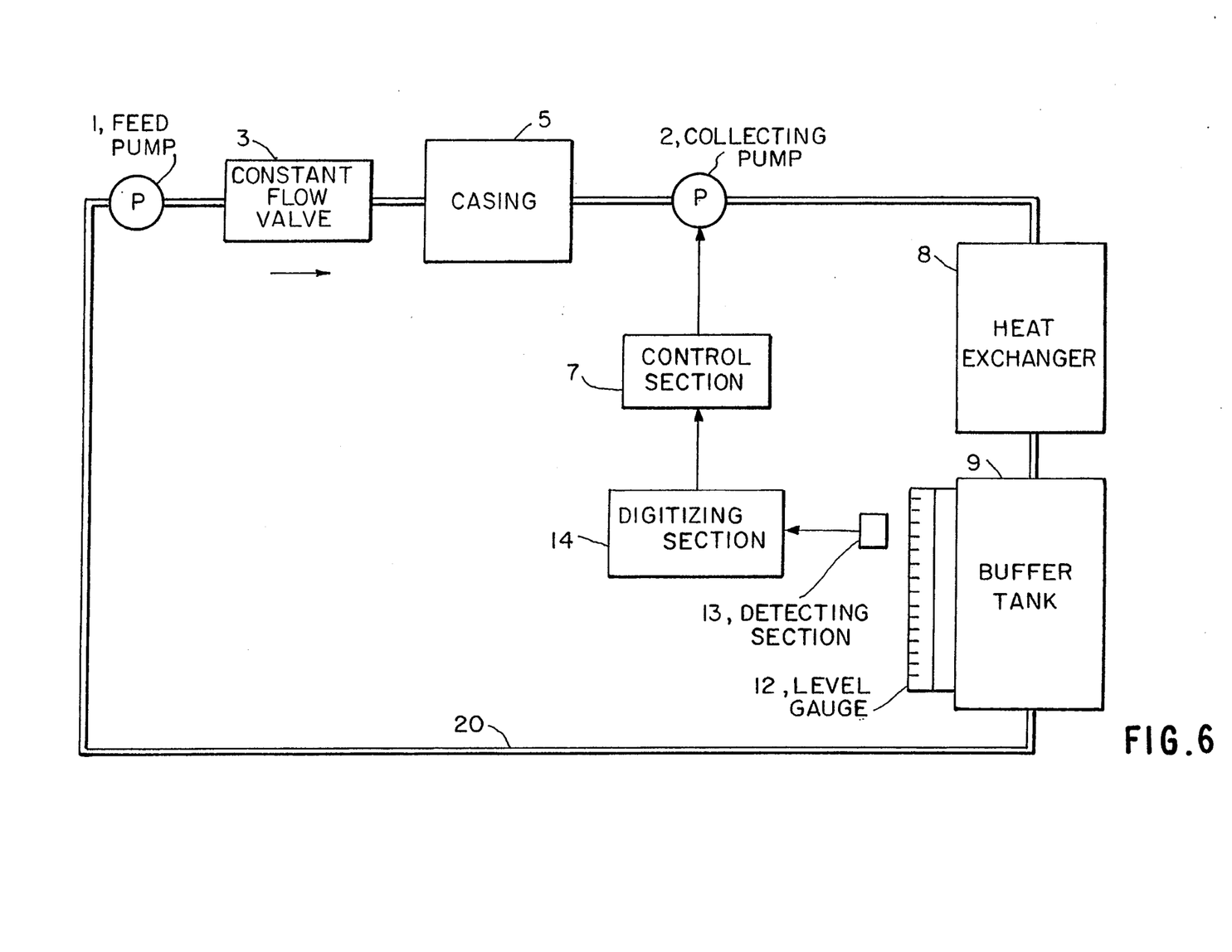

A sixth embodiment of the present invention is shown in FIG. 6 and includes the feed pump 1, collecting pump 2 constant flow valve 3, casing 5, heat exchanger 8, and buffer tank 9. A level gauge 12 measures the level of the coolant existing in the buffer tank 9. A detecting section 13 monitors the level gauge 12 to determine the liquid level in the buffer tank 9. A digitizing section 14 converts the liquid level detected by the detecting section 13 to a digital or numerical value. The control section 7 controls the output of the collecting pump 2 in response to the numerical data sent from the digitizing section 14. The constituents 1, 2, 3, 5, 8 and 9 are fluidly communicated by the piping 20.

In operation, the coolant is feed from the fed pump 1 to the casing 5 at a predetermined flow rate via the constant flow valve 3. Implemented by a CCD (Charge Coupled Device) camera, for example, the detecting section 13 constantly monitors the level gauge 12 to determine the liquid level in the buffer tank 9. As the detecting section 13 sends a signal representative of a liquid level to the digitizing section 14, the digitizing section 14 converts it to a numerical value and delivers the numerical value to the control section 7. In response, the control section 7 controls the output of the pump 2 such that the data representative of the liquid level of the buffer tank 9 remains constant. This control may also be implemented with a linear control mechanism using an inverter.

As stated above, this embodiment controls the output of the collecting pump 2 in such a manner as to maintain the liquid level in the buffer tank 9 constant. Hence, the pressure in the casing 5 is maintained constant, so that the advantages stated in relation to the first embodiment are achieved.

Figure 7:
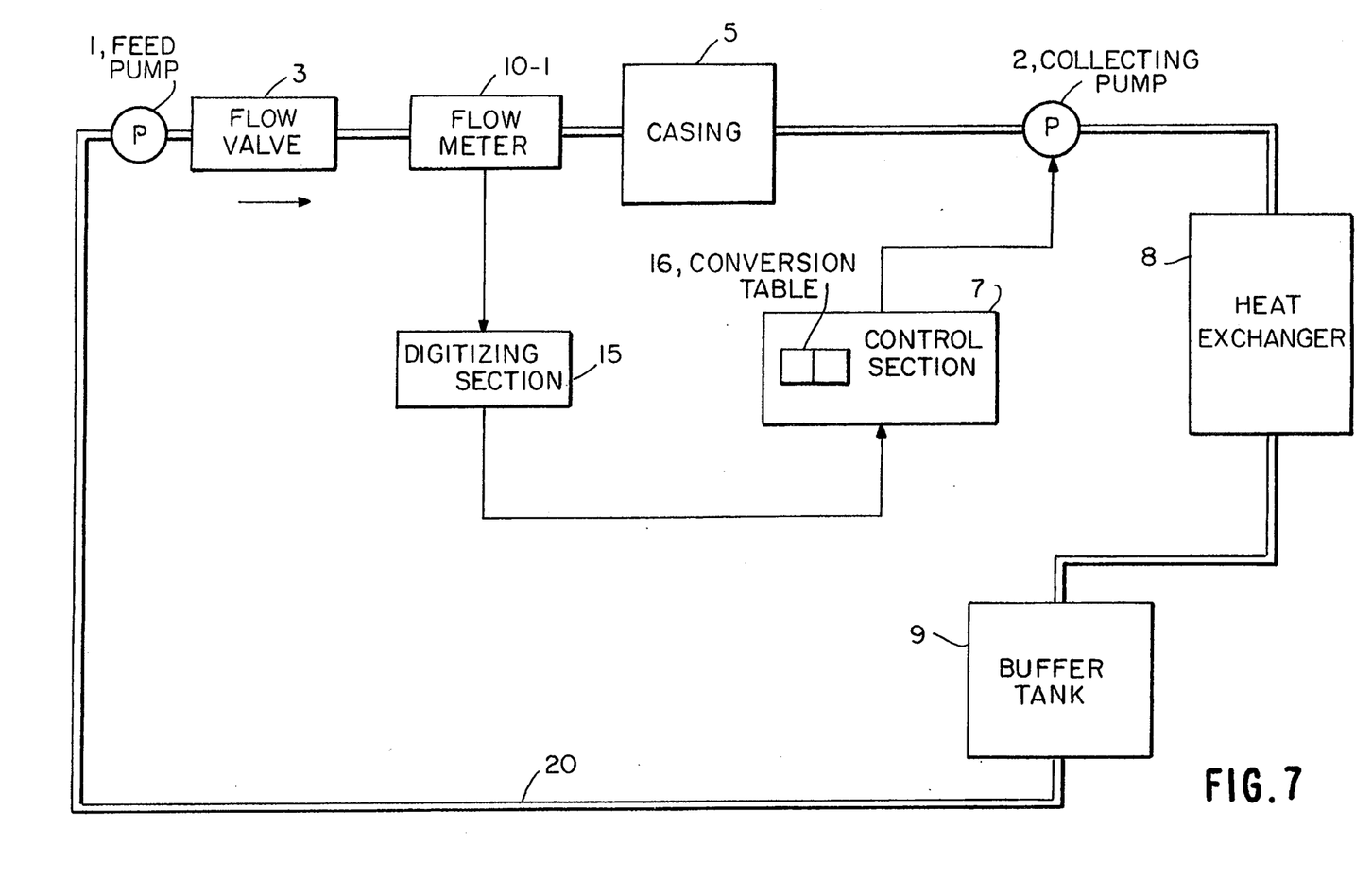

FIG. 7 shows a seventh embodiment of the present invention also including the feed pump 1, collecting pump 2, constant flow valve 3, casing 5, heat exchanger 8, buffer tank 9, and electronic flow meter 10-1 responsive to the flow rate of the coolant between the valve 3 and the casing 5. A digitizing section 15 converts the flow rate measured by the flow meter 10-1 to a numerical value. The output of the collecting pump 2 necessary to maintain the same flow rate as the digital flow rate sent from the digitizing section 15 is read out of a conversion table 16. The control section 7 determines requisite output of the collecting pump 2 on the basis of the conversion table 16.

In operation, the coolant from the feed pump 1 flows into the casing 5 at a constant flow rate via the constant flow valve 3. The flow meter 10-1 intervening between the valve 3 and the casing 5 measures the flow rate of the coolant flowing toward the casing 1 and sends it to the digitizing section 15. The digitizing section 15 converts the measured flow rate to a numerical value and delivers the numerical value to the control section 7. In response, the control section 7 scans the conversion table 16 on the basis of the received flow rate so as to find pump control data needed to maintain the same flow rate. Then, the control section 7 determines the output of the collecting pump 2 matching the flow rate found on the conversion table 16.

As described above, this embodiment selects a particular output of the collecting pump 2 by referencing the conversion table 16 on the basis of the actual flow rate of the coolant to the casing 5. This maintains the pressure in the casing 5 constant substantially at the atmospheric level, thereby attaining the advantages described in relation to the first embodiment.

While the present invention has been described in conjunction with the preferred embodiments thereof, it will now be readily possible for those skilled in the art to put the present invention into practice in various other manners.

What is claimed is:

1. A liquid coolant circulation control system for an immersion cooling system, comprising:
   a casing accommodating electronic circuits to be immersed in and cooled by a liquid coolant;
   a collecting pump for collecting the liquid coolant from said casing;
   first measuring means for measuring a flow rate of the liquid coolant flowing into said casing;
   second measuring means interposed between said casing and said collecting pump for measuring a flow rate of the liquid coolant flowing out of said casing;
   determining means for calculating a difference between the flow rates measured by said first and second measuring means; and
   control means for controlling an operation of said collecting pump such that the difference determined by said determining means remains at a predetermined value.

2. A liquid coolant circulation control system according to claim 1, wherein the control means controls the operation of said collecting pump such that said difference between the flow rates is reduced to zero.

3. A liquid coolant circulation control system according to claim 1, wherein said control means further comprises a linear control mechanism using an inverter.

4. A liquid coolant circulation control system according to claim 1, wherein said control means controls the operation of said collecting pump such that pressure in said casing is substantially equal to atmospheric pressure.

5. A liquid coolant circulation control system according to claim 1, further comprising a buffer tank for absorbing an increase or decrease in the volume of the liquid coolant due to temperature.

6. A liquid coolant circulation control system according to claim 1, further comprising a heat exchanger for cooling the liquid coolant to a predetermined temperature.

7. A liquid coolant circulation control system according to claim 1, further comprising a feed pump for feeding the liquid coolant to said casing.

* * * * *